United States Patent [19]

Littmann et al.

[11] Patent Number: 5,124,237

[45] Date of Patent: Jun. 23, 1992

[54] PRODUCTION OF PHOTOPOLYMERIZED RELIEF PRINTING PLATES HAVING A NON-TACKY SURFACE

[75] Inventors: Dieter Littmann, Mannheim; Horst Koch, Gruenstadt, both of Fed. Rep. of Germany

[73] Assignee: BASF Aktiengesellschaft, Ludwigshafen, Fed. Rep. of Germany

[21] Appl. No.: 476,900

[22] Filed: Feb. 8, 1990

[51] Int. Cl.⁵ .................................. G03F 7/40
[52] U.S. Cl. .................................. 430/309; 430/306; 430/331
[58] Field of Search ............... 430/309, 306, 331

[56] References Cited

U.S. PATENT DOCUMENTS

| | | | |
|---|---|---|---|
| 4,400,459 | 8/1983 | Gruetzmacher et al. | 430/306 |
| 4,603,058 | 7/1986 | Adams | 427/54.1 |
| 4,716,094 | 12/1987 | Minonishi et al. | 430/284 |
| 4,725,528 | 2/1988 | Koch et al. | 430/309 |
| 4,806,506 | 2/1989 | Gibson, Jr. | 430/309 |
| 4,906,551 | 3/1990 | Herrmann | 430/309 |

FOREIGN PATENT DOCUMENTS 57-52051 3/1982 Japan.

*Primary Examiner*—Marion E. McCamish
*Assistant Examiner*—Janis L. Dote
*Attorney, Agent, or Firm*—Keil & Weinkauf

[57] ABSTRACT

A relief printing plate whose photopolymerized relief layer has a non-tacky surface is produced by (1) imagewise exposure of a photopolymerizable relief-forming recording layer which contains one or more polymeric binders containing acid groups, (2) washing out (development) of the unexposed and therefore non-photopolymerized parts of the imagewise exposed relief-forming recording layer with a developer and (3) aftertreatment of the resulting photopolymerized relief layer with a basic aftertreatment solution.

12 Claims, No Drawings

PRODUCTION OF PHOTOPOLYMERIZED RELIEF PRINTING PLATES HAVING A NON-TACKY SURFACE

The present invention relates to a novel process for the production of relief printing plates whose photopolymerized relief layer has a non-tacky surface by (1) imagewise exposure of a photopolymerizable relief-forming recording layer which contains one or more polymeric binders containing acid groups, (2) washing out (development) of the unexposed and therefore non-photopolymerized parts of the imagewise exposed relief-forming recording layer with a developer and (3) aftertreatment of the resulting photopolymerized relief layer with an aftertreatment solution.

Photopolymerizable relief printing plates which contain, in their photopolymerizable relief-forming recording layer, one or more polymeric binders containing acid groups and processes for the production of relief printing plates having photopolymerized relief layers therefrom are disclosed in DE-A-25 17 043, DE-B-27 20 28, DE-A-29 02 412, DE-A-30 12 841, U.S. Pat. No. 4,415,649, EP-A-0 076 028, U. S. Pat. No. 4 517 279, EP-A-0 162 570, EP-A-0 164 270, EP-A-0 183 552, EP-A-0 223 114, EP-A-0 226 153, EP-A-0 231 002 or EP-A-0 293 750.

It is also known that the photopolymerized relief layers of relief printing plates which have been produced from relief printing plates having photopolymerizable relief-forming recording layers of the stated type or another type can be aftertreated to render them non-tacky. This aftertreatment can be carried out, on the one hand, with the aid of halogen-containing or halogen-releasing aftertreatment solutions (cf. EP-B-0 021 829, U.S. Pat. No. 4,267,214, DE-A-28 23 300, U.S. Pat. No. 4 400 459, EP-A-0 064 564, EP-A-0 096 835, EP-A-0 208 943 or EP-A-0 256 309) or by means of short-wavelength UV light (cf. U.S. Pat. Nos. 3,506,440, 4,415,654, 4,202,696, EP-B-0 017 927 or EP-A-0 154 994).

However, the aftertreatment processes known to date have disadvantages. For example, aftertreatment with short-wavelength UV light does of course require more expensive apparatus for safety reasons, among other things because, during exposure of the photopolymerized relief layers of the relief printing plates, the oxygen of the air surrounding them is converted into highly toxic ozone, which furthermore damages the photopolymerized relief layers themselves. This damage can only be avoided if postexposure of the photopolymerized relief layers is carried out under nitrogen, under water or under an aqueous alkali metal or alkaline earth metal sulfite solution, which, however, necessitates the use of even more expensive apparatus. In addition, aftertreatment by means of short-wavelength UV light either does not render the surface of the polymerized relief layers of the type stated at the outset completely non-tacky or makes them brittle.

From the points of view of environmental protection, occupational hygiene and feasiblity, the corrosive halogen-containing or halogen-releasing aftertreatment solutions are disadvantageous. Thus, the components of these aftertreatment solutions cannot be sent as a premix to the end user but must be combined by the end user himself in the correct proportions directly before use, a procedure which requires the end user, i.e. the reprographer, to have a certain degree of chemical knowledge outside his field, for safety reasons alone. Furthermore, the times required for the aftertreatment must be very exactly adhered to since otherwise the aftertreated surfaces of the photopolymerized relief layers become brittle and tend to crack. Moreover, these aftertreatment solutions are generally very unstable and have only a short life. If they are not used at the correct time, unforseeable aftertreatment results which do not conform to practical requirements are obtained. In addition, drop marks may form on surfaces aftertreated in this manner when the halogen residues are washed away, the said marks adversely affecting the printed copies Furthermore, photopolymerized relief layers whose surface has such drop marks become tacky again during relatively long print runs.

However, because excessive surface tack of the photopolymerized relief layers of relief printing plates, in particular of flexographic relief printing plates, leads to picking and tearing of the paper webs during printing, and furthermore fine image elements are blurred through picked paper fibers, there is still a need for aftertreatment methods which eliminate or at least reduce this printing problem. Since, however, the conventional aftertreatment methods themselves have serious disadvantages, it is necessary to find new ways of solving the problem.

It is an object of the present invention to provide a novel process for the production of a relief printing plate whose photopolymerized relief layer has a non-tacky surface, and the novel process should not have the above disadvantages of the prior art.

We have found, surprisingly, that this object is achieved in an elegant manner in the relief printing plates having photopolymerized relief layers of the type stated at the outset by aftertreatment of the photopolymerized relief layer with a basic aftertreatment solution.

The present invention therefore relates to a process for the production of a relief printing plate whose photopolymerized relief layer has a non-tacky surface, by (1) imagewise exposure of a photopolymerizable relief-forming recording layer (A), which contains
  $a_1$) one or more polymeric binders containing acid groups,
  $a_2$) one or more olefinically unsaturated photopolymerizable monomers which are compatible with the polymeric binders ($a_1$) containing acid groups and
  $a_3$) one or more photopolymerization initiators, (2) washing out (development) of the unexposed and therefore non-photopolymerized parts of the imagewise exposed relief-forming recording layer (A) with a developer and (3) aftertreatment of the resulting photopolymerized relief layer with an aftertreatment solution, wherein a basic aftertreatment solution is used in process step (3).

The novel process for the production of a relief printing plate whose photopolymerized relief layer has a non-tacky surface will be referred to below as the "novel process" for the sake of brevity.

The step of the novel process which is essential to the invention is process step (3). This comprises the aftertreatment of the photopolymerized relief layer resulting from process steps (1) and (2) of the novel process with an aftertreatment solution. According to the invention, a basic aftertreatment solution is used for this purpose.

The aftertreatment solution to be used according to the invention contains one or more solvents and one or more bases.

Suitable solvents are both aprotic polar solvents and protic polar solvents as well as mixtures of aprotic and protic polar solvents.

Examples of suitable aprotic polar solvents are di-n-butyl ether, tetrahydrofuran, dioxane, acetone, methyl ethyl ketone, acetylacetone, ethyl acetate, acetonitrile and methylpyrrolidone.

Examples of suitable protic polar solvents are water, methanol, ethanol, n-propanol, isopropanol, n-butanol, acetic acid, ethylene glycol, diethylene glycol and diethylene glycol monomethyl ether.

Examples of very suitable solvents are water, glycol, n-butanol and diethylene glycol, among which water is very particularly preferably used.

Examples of suitable bases to be used according to the invention are metal hydroxides, basic metal salts, organic amines and ammonia.

Examples of suitable metal hydroxides are the alkali metal hydroxides, the alkaline earth metal hydroxides, scandium hydroxides, yttrium hydroxides, lanthanum hydroxides and the lanthanide hydroxides, among which sodium hydroxide, potassium hydroxide, calcium hydroxide, strontium hydroxide and barium hydroxide are particularly suitable. Among these in turn, sodium hydroxide is very particularly suitable.

Examples of suitable basic metal salts to be used according to the invention are basic alkali metal, alkaline earth metal, scandium, yttrium, lanthanum and lanthanide salts, among which the sodium and potassium salts are particularly suitable and the sodium salts are very particularly suitable.

Further examples of suitable basic salts to be used according to the invention are carbonates, phosphates, borates, carboxylates, alkoxides and phenoxides, among which the alkali metal, alkaline earth metal, scandium, yttrium, lanthanum and lanthanide carbonates, phosphates, borates, carboxylates, alkoxides and phenoxides are particularly suitable.

Examples of particularly suitable basic salts to be used according to the invention are sodium acetate, sodium propionate, sodium carbonate, potassium carbonate, sodium borate, sodium methylate and sodium ethylate, among which sodium carbonate is very particularly preferably used.

Examples of suitable organic amines to be used according to the invention are primary, secondary and tertiary acyclic and cyclic amines, such as methyl-, ethyl-, n-propyl-, n-butyl-, n-pentyl- and n-hexylamine; dimethyl-, diethyl-, di-n-propyl-, di-n-butyl-, di-n-pentyl- and di-n-hexylamine; trimethyl-, triethyltri-n-propyl-, tri-n-butyl-, tri-n-pentyl- and tri-n-hexylamine; cyclohexyl- and dicyclohexylamine; morpholine, piperazine, imidazolidine, piperidine, 1,3-thiaazolidine, perhydro-1,4-thiazine, N-ethylmorpholine, N-methylpiperazine, N-ethylpiperazine, N-propylimidazolidine, N-hexyl-1,3-thiaazolidine, N-(2-hydroxyethyl)-piperazine, N-(3-hydroxy-n-propyl)piperazine, N-(6-hydroxy-n-hexyl)-piperazine, N-[ω-hydroxypoly-(ethylene oxide)-α-yl]-piperazine and N-[ω-hydroxypoly-(propylene oxide)-α-yl]-piperazine, N-methyl-N-(2-hydroxyethyl)-amine, N,N-bis-(2-hydroxyethyl)-amine, N-propyl-N-(2-hydroxyethyl)-amine, N-butyl-N-(2-hydroxyethyl)-amine, N-methyl-N-(2-hydroxypropyl)-amine, N,N-bis-(2-hydroxypropyl)-amine, N-propyl-N-(5-hydroxy-3-oxapentyl)-amine, N,N,N',N'-tetra-(2-hydroxyethyl)-ethylenediamine, N,N,N',N'-tetramethylbutane-1,4-diyldiamine, ethylenediamine, diethylenetriamine, N-methyl-N-ethylethylenediamine, N,N-dimethylethylenediamine, N,N'-diethylethylenediamine, N,N,N'',N',-tetramethylethylenetriamine, propane-1,3diyldiamine and butane-1,4-diyldiamine, and polyethyleneimine. Among these amines, bifunctional and polyfunctional amines are preferred.

The bases are present in an amount of from 0.05 to 10, advantageously from 0.01 to 5, in particular from 0.05 to 2.5, % by weight, based on the particular aftertreatment solution, in the aftertreatment solutions to be used according to the invention. The amount of the base or bases in the aftertreatment solution used in each case depends on the one hand on the nature and composition of that surface of the photopolymerized relief layer which is to be aftertreated and on the other hand on the solubility of the relevant base or bases in the solvents used in each case. Hence, the required composition of the aftertreatment solution can be determined by the skilled worker from simple preliminary experiments.

In addition to the solvents and bases described above, the aftertreatment solution to be used according to the invention may contain surfactants in an amount of from 0.001 to 1% by weight, based on the relevant aftertreatment solution. In principle, all surfactants which do not decompose in the presence of the abovementioned bases and are soluble in the solvent used in each case are suitable for this purpose. Examples of suitable surfactants are the cationic and anionic amphiphiles which have a saturated hydrocarbon chain of 8 to 20 carbon atoms or one or more perfluorinated carbon chains of 5 to 18 carbon atoms, ethylene oxide/propylene oxide block copolymers and alkylglucosides. Examples of very suitable surfactants are described in EP-A-0 208 943.

In terms of the method, the aftertreatment of the surface of the photopolymerized relief layers (process step 3), which aftertreatment is essential to the invention, has no special features but is carried out in the novel process after the imagewise exposure of the photopolymerizable relief-forming recording layer (A) of the photopolymerizable relief printing plate (process step 1) and washing out (development) of the unexposed and hence non-photopolymerized parts of the imagewise exposed relief-forming recording layer (A) with a developer (process step 2). For this purpose, the photopolymerized relief layer produced in this manner can be sprayed, in process step (3), with the aftertreatment solution to be used according to the invention, or the photopolymerized relief layers or the relief printing plates can be immersed in an aftertreatment bath which contains the aftertreatment solution to be used according to the invention. Regardless of the method used for the aftertreatment, the time during which the particular aftertreated surface of a photopolymerized relief layer is in contact with the aftertreatment solution is from 10 s to 15 min, preferably from 30 s to 5 min, in particular from 1 to 3 min.

The novel process is carried out using relief printing plates which contain a conventional photopolymerizable relief-forming recording layer (A). The said recording layer (A) in turn contains one or more polymeric binders ($a_1$) containing acid groups, one or more olefinically unsaturated photopolymerizable monomers ($a_2$) which are compatible with the binders ($a_1$), and one or more photopolymerization initiators ($a_2$). Examples of relief printing plates having suitable photopolymerizable relief-forming recording layers (A) of the stated type are described in DE-A-25 17 043, DE-B-27 20 228, DE-A-29 02 412, DE-A-30 12 841, U.S. Pat. No. 4 415 649, EP-A-0 076 028, U.S. Pat. No. 4,517,279, EP-A-0 162 570, EP-A-0 164 270, EP-A-0 183 552, EP-A-0 223 114, EP-A-0 226 153, EP-A-0 231 002 and EP-A-0 293 750.

The photopolymerizable relief-forming recording layers (A) of EP-A-0 223 114, of EP-A-0 231 002 or of EP-A-0 293 750, which contain modified or unmodified copolymers of ethylene with (meth)acrylic acid and one or more vinyl esters, vinyl ethers, (meth)acrylates and/or (meth)acrylamide as polymeric binders ($a_1$) containing acid groups or carboxyl groups, or those of EP-A-0 226 153, which contain maleated and partially esterified or partially amidated polybutadienes as polymeric binders ($a_1$) containing acid groups or carboxyl groups, are particularly preferably used.

It is known that these photopolymerizable reliefforming recording layers (A) contain not only the above-mentioned COOH-containing polymeric binders ($a_1$) but always also olefinically unsaturated photopolymerizable monomers ($a_2$) which are compatible therewith, and the photopolymerization initiators ($a_3$) required for initiating the photopolymerization, in the conventional amounts. Furthermore, the said recording layers (A) may contain further additives, such as thermal polymrization inhibitors, dyes, pigments, photochromic substances, antihalation agents, plasticizers, antioxidants, antiozonants, agents for improving the relief structure, crosslinking assistants, fillers and/or reinforcing fillers, in effective amounts.

In the novel process, these conventional photopolymerizable relief-forming recording layers (A) are exposed imagewise to actinic light in a conventional manner (process step 1). Examples of suitable sources of actinic light are the conventional and known high pressure, medium pressure and low pressure mercury lamps, UV fluorescence tubes and lamps doped with metal halides.

The unexposed and hence non-photopolymerized parts of the imagewise exposed relief-forming recording layer (A) are then washed out or developed with a developer (process step 2). Development is known to be carried out in the conventional and known spray and brush washers. Examples of suitable developers are the aprotic polar and protic polar solvents described above.

The novel process may comprise further conventional process steps in addition to process steps (1) and (2) and process step (3) which is essential to the invention.

Examples of suitable further conventional process steps are uniform preexposure of the photopolymerizable relief-forming recording layer (A) of the relief printing plate, drying steps which follow process steps (2) and (3), and uniform postexposure of the photopolymerized relief layer produced in the manner according to the invention.

The novel process has many advantages over the prior art. For example, the relief printing plates produced in the manner according to the invention have a photopolymerized relief layer whose surface is non-tacky. These relief printing plates are therefore very useful for lithographic printing, letterpress printing and flexographic printing and can also be used as photoresists. They are preferably employed for flexographic printing, in particular for the printing of continuous stationery. Furthermore, the components of the aftertreatment solutions to be used according to the invention can be supplied to the reprographer in the form of a ready-prepared, easily meterable mixture which has an unlimited shelf life, and in general no extensive technical safety measures are required for production, handling and disposal of the aftertreatment solutions and the user need not have any special chemical knowledge. In addition, the optimum aftertreatment times determined by preliminary experiments need not be stringently adhered to in order to avoid damaging the surface of the photopolymerized relief layers; instead, they may be exceeded without problems if required by the procedure, permitting considerably more latitude in coordination of operation in a reprographic unit. An additional advantage is that the aftertreatment solutions to be used according to the invention have a relatively long shelf life and can be very easily regenerated even after prolonged standing and/or repeated use, without this leading to disadvantageous results. Moreover, they are less corrosive than the known aftertreatment solutions. In addition, the aftertreatment step to be carried out according to the invention improves the surface of the photopolymerized relief layer not only with regard to its tack but also in respect of the uniformity of its matt finish and its optical homogeneity, as well as its stability to embrittlement and cracking on prolonged storage and/or sustained use. The relief printing plates produced by the procedure according to the invention can therefore be used much more frequently and for longer in flexographic printing than relief printing plates produced by prior art processes. The relief printing plates produced in the manner according to the invention accordingly give a very much longer print run of excellent copies. In addition, the non-tacky surface of their photopolymerized relief layers have excellent ink acceptance but are extremely stable to the printing ink solvents and are not swelled by these to a troublesome extent.

EXAMPLES AND COMPARATIVE EXPERIMENTS

In the Examples and Comparative Experiments which follow, the tack of the surface of the photopolymerized relief layers was determined either by measuring the surface tack according to DIN 53,157 or by touch. The tack determined by touch was rated as follows:

Rating 1—non-tacky
Rating 2—slighty tacky
Rating 3—very tacky.

Experimental method:

For Examples 1 to 5 and Comparative Experiment V1, 6 relief printing plates having the same composition and the same structure were produced as follows: A 0.24 mm thick steel sheet as usually used as a substrate for relief printing plates was provided with a conventional known primer layer about 15 μm thick and with a conventional known adhesion-promoting layer about 5 μm thick. Thereafter, the 500 μm thick photopolymerizable relief-forming recording layer (A) was laminated with the adhesion-promoting layer. The said recording layer (A) itself consisted of 63.6% by weight of a copolymer of 60% by weight of butadiene, 20% by weight of acrylic acid and 20% by weight of n-butyl acrylate, the percentages being based on the copolymer, and had a melt flow index (MFI) of 300 g/10 min (measured at 190° C. and under an applied force of 21 N) (polymeric binder a containing acid groups), 11.9% by weight of hexane-1,6-diol diacrylate (monomer $a_2$), 7.9% by weight of N-n-propyl-N-(2-hydroxyethyl)-amine, 3.95% by weight of glycidyl methacrylate (monomer az), 1.5% by weight of benzil dimethyl acetal (photopolymerization initiator $a_3$), 3.17% by weight of hydroquinone monomethyl ether and 7.98% by weight of N-n-butylbenzenesulfonamide.

The 6 relief printing plates were stored for 5 days at room temperature and then processed further as follows:

EXAMPLE 1

One of the 6 relief printing plates described above was exposed imagewise in a flat-plate exposure unit in a conventional and known manner and then developed with pure water. The relief printing plate obtained in this manner and having a photopolymerized relief layer was first dried and then postexposed for 3 minutes in a flat-plate exposure unit (light output 40 watt). After the postexposure, the relief printing plate was immersed in a 2% strength sodium carbonate solution for 30 seconds and then dried. The surface of its photopolymerized relief layer was virtually completely non-tacky (surface tack according to DIN 53,157: 7).

EXAMPLE 2

Example 1 was repeated, except that the aftertreatment time (immersion time) was 1 minute. Thereafter, the photopolymerized relief layer of the relief printing plate had a non-tacky surface (surface tack according to DIN 53,157: 10).

EXAMPLE 3

Example 1 was repeated, except that the relief printing plate was immersed for 30 seconds in 1% strength sodium hydroxide solution. Thereafter, the surface of the photopolymerized relief layer was completely non-tacky (surface tack according to DIN 53,157: 32).

EXAMPLE 4

Example 3 was repeated, except that the aftertreatment time (immersion time) was 1 minute. The surface of the polymerized relief layer was completely non-tacky (surface tack according to DIN 53,157: 43).

EXAMPLE 5

Example 4 was repeated, except that a solution of 0.5% by weight of sodium hydroxide, 0.1% by weight of a surfactant (sodium paraffinsulfonate) and 99.4% by weight of water was used instead of the 1% strength sodium hydroxide solution. The photopolymerized relief layer aftertreated in this manner was completely non-tacky both on the relief surface and in the relief ground.

The relief printing plate was clamped on a printing cylinder and used for flexogrphic printing of continuous stationery on a conventional known flexographic printing unit employing ethanol-containing flexographic printing inks. Excellent printed copies were obtained, the quality of the prints themselves remaining unchanged after a print run of 100,000 copies.

COMPARATIVE EXPERIMENT V1

Example 5 was repeated, except that the relief printing plate was not subjected to the aftertreatment to be used according to the invention. The surface of the photopolymerized relief layer of the relief printing plate was therefore very tacky (surface tack according to DIN 53,157: 2). Furthermore, crisp printed copies were not obtained in flexographic printing of continuous stationery; in addition, the print run was short owing to the substantially poorer stability of the relief printing plate under printing conditions.

EXAMPLE 6 AND COMPARATIVE EXPERIMENT V2

To carry out Example 6 and Comparative Experiment V2, a photopolymerizable mixture was prepared by extruding 7.82 kg of a copolymer of 57.1% by weight of ethylene, 18.9% by weight of acrylic acid and 24% by weight of 2-ethylhexyl acrylate (polymeric binder $a_1$ containing acid groups), the percentages in each case being based on the copolymer, 500 g of glycidyl methacrylate (monomer $a_2$), 500 g of methyl methacrylate (monomer $a_2$), 100 g of benzil dimethyl acetal (photopolymerization initiator $a_3$), 2.5 g of N-methylimidazole, 25 g of 2,6-di-tert-butyl-p-cresol, 750 g of N-n-butylbenzenesulfonamide, 40 g of the potassium salt of N-nitrosocyclohexylhydroxylamine and 3 g of safranine T (C.I. 50,240). The photopolymerizable mixture was discharged from the extruder and formed in a calender into the photopolymerizable relief-forming recording layer (A) having a thickness of 2675 $\mu$m. While it was being shaped, the said recording layer (A) was firmly bonded on one side to a polyethylene terephthalate substrate film, which had been provided with a conventional known adhesion-promoting layer, and on its other side with a polyethylene terephthalate cover sheet, which had been coated with a top layer consisting of a polyvinyl alcohol, to give a relief printing plate having a total thickness of 3,000 $\mu$m.

The relief printing plate obtained in this manner was preexposed to actinic light through its back for 60 seconds. Thereafter, the polyethylene terephthalate cover sheet was removed, and a standard negative was placed on the surface of the polyvinyl alcohol top layer firmly adhering to the photopolymerizable relief-forming recording layer (A). The said recording layer (A) was then exposed imagewise through the standard negative for 20 minutes in a tubular flat-plate exposure unit. After the imagewise exposure, the unexposed and therefore nonphotopolymerized parts of the imagewise exposed relief-forming recording layer (A) were washed out for 30 seconds in a spray washer with pure water and then for 5 minutes in a rotary brush washer with a mixture of perchloroethylene and n-butanol in a volume ratio of 4:2. The relief printing plate obtained in this manner and having a photopolymerized relief layer was dried for 60 minutes at 60° C. and, after drying, postexposed for 20 minutes in a tubular flat-plate exposure unit. The relief printing plate was then divided into halves. One half was used for carrying out Example 6 and the other half for carrying out Comparative Experiment V2.

COMPARATIVE EXPERIMENT V2

The half of the relief printing plate which was used for this purpose was not further aftertreated. Accordingly, the surface of its photopolymerizable relief-forming recording layer (A) was extremely tacky (rating 3, determined by touch). After this half of the relief printing plate had been clamped on a printing cylinder, it was used for flexographic printing of continuous stationery in a conventional known flexographic printing unit employing ethanol-containing flexographic printing inks. Satisfactory printed copies could not be obtained. In addition, the print run was short owing to the substantially poorer stability of the photopolymerized relief layer which had not been further aftertreated.

EXAMPLE 6

The other half of the relief printing plate was subjected to the aftertreatment process described in Example 5, with the result that the photopolymerized relief layer now had a completely non-tacky surface (rating 1, determined by touch). When this half of the relief printing plate, which had been aftertreated in the manner according to the invention, was used for flexographic printing of continuous stationery employing ethanol-containing flexographic printing inks, excellent printed copies were obtained in a print run of well over 100,000 copies.

We claim:

1. A process for the production of a relief printing process whose photopolymerized relief layer has a non-tacky surface, the said process consisting of the steps of
   (1) imagewise exposure of a photopolymerizable relief-forming recording layer (A), which contains
      $a_1$) one or more polymeric binders containing acid groups,
      $a_2$) one or more olefinically unsaturated photopolymerizable monomers which are compatible with the polymeric binders ($a_1$) containing acid groups and
      $a_2$) one or more photopolymerization initiators,
   (2) washing out (developing) the unexposed and therefore non-photopolymerized parts of the imagewise exposed relief-forming layer (A) with a developer and
   (3) aftertreating the resulting photopolymerized relief layer with a basic aftertreatment solution which consists of one or more solvents and one or more bases.

2. A process as defined in claim 1, wherein the polymeric binder ($a_1$) containing acid groups contains carboxyl groups.

3. A process as defined in claim 1, wherein solvents selected from the group consisting of aprotic polar and protic polar solvents are used.

4. A process as defined in claim 1, wherein bases selected from the group consisting of the metal hydroxides and basic metal salts are used.

5. A process as defined in claim 4, wherein the metal of the basic metal salts used in the process is selected from the group consisting of alkali metal, alkaline earth metal, scandium, yttrium, and lanthanum.

6. A process as defined in claim 5, wherein basic metal salts selected from the group consisting of the carbonates, phosphates, borates, carboxylates, alkoxides and phenoxides are used in the process, the said salts being soluble in aprotic polar and protic polar solvents.

7. A process as defined in claim 4, wherein basic metal salts selected from the group consisting of the carbonates, phosphates, borates, carboxylates, alkoxides and phenoxides are used in the process, the said salts being soluble in aprotic polar and protic polar solvents.

8. A process as defined in claim 4, wherein the base that is used is sodium hydroxide.

9. A process as defined in claim 4, wherein the base that is used is selected from the group consisting of sodium acetate, sodium propionate, sodium carbonate potassium carbonate, sodium borate, sodium methylate and sodium ethylate.

10. A process as defined in claim 4, wherein the base that is used is sodium carbonate.

11. A process as defined in claim 1, wherein the bases used are organic amines and/or ammonium.

12. A process as defined in claim 1, wherein a bifunctional or polyfunctional organic amine is used as the base.

* * * * *

UNITED STATES PATENT AND TRADEMARK OFFICE
CERTIFICATE OF CORRECTION

PATENT NO. : 5,124,237

DATED : June 23, 1992

INVENTOR(S) : Dieter LITTMANN, Horst KOCH

It is certified that error appears in the above-identified patent and that said Letters Patent is hereby corrected as shown below:

On title page, item [56]
Under Foreign Application Priority Data, insert

Feb. 17, 1989 [DE]  Fed Rep. of Germany ....... 3904780

Signed and Sealed this

Twenty-sixth Day of July, 1994

Attest:

BRUCE LEHMAN

Attesting Officer     Commissioner of Patents and Trademarks